(12) United States Patent
Takayama

(10) Patent No.: US 6,400,839 B1
(45) Date of Patent: Jun. 4, 2002

(54) RETICLE INSPECTING APPARATUS CAPABLE OF SHORTENING AN INSPECTING TIME

(75) Inventor: Naohisa Takayama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/296,266

(22) Filed: Apr. 22, 1999

(30) Foreign Application Priority Data

Apr. 24, 1998 (JP) .......................................... 10-115049

(51) Int. Cl.⁷ ................................................. G06K 9/00
(52) U.S. Cl. ......................................... 382/145; 716/19
(58) Field of Search ................................ 382/145, 140, 382/141, 142, 143, 144, 146; 250/492.3; 716/19, 21

(56) References Cited

U.S. PATENT DOCUMENTS

| 4,996,434 A | * | 2/1991 | Tanaka ..................... 250/492.3 |
| 5,185,812 A | * | 2/1993 | Yamashita .................. 382/145 |
| 5,737,072 A | * | 4/1998 | Emery et al. ................. 356/73 |

FOREIGN PATENT DOCUMENTS

| JP | 58-48838 | 3/1983 |
| JP | 01-137376 | 5/1989 |
| JP | 06-325162 | 11/1994 |

* cited by examiner

Primary Examiner—Andrew W. Johns
Assistant Examiner—Seyed Azarian
(74) Attorney, Agent, or Firm—Sughrue Mion, PLLC

(57) ABSTRACT

A reticle inspecting apparatus comprises an image-pickup optical system (4, 5) for picking up an image of a pattern of a reticle mounted on an XY stage (3) to obtain a picked-up image pattern having first through N-th (N being an integer not smaller than two) frames, first through M-th (M being an integer not smaller than two and not greater than N) image comparators (71–74), a distributor (6) for distributing the first through the N-th frames of the picked-up image pattern to the first through the M-th image comparators (71–74) one after another, and an inspection controller (1) for converting CAD (Computer Aided Design) data used in drawing the pattern of the reticle into first through N-th intermediate data corresponding to the first through the N-th frames of the picked-up image pattern and for preliminarily transferring the first through the N-th intermediate data to the first through the M-th image comparators (71–74) one after another. The first through the M-th image comparators (71–74) compare the first through the N-th frames of the picked-up image pattern with first through N-th reference images produced from the first through the N-th intermediate data, respectively.

10 Claims, 6 Drawing Sheets

RETICLE INSPECTING APPARATUS CAPABLE OF SHORTENING AN INSPECTING TIME

BACKGROUND OF THE INVENTION

This invention relates to an inspecting apparatus for inspecting the appearance of a pattern of a reticle for producing an integrated circuit.

In order to inspect the appearance of a reticle for producing an LSI (Large-Scale Integrated circuit), two methods are known. One of the two methods is "die-to-die inspection" of comparing identical patterns or dies on different locations on a single common reticle. The die-to-die inspection method is disclosed in Japanese Unexamined Patent Publication (JP-A) No. 10-282008 (282008/1998). The other of the two methods is "die-to-database inspection" of comparing a reticle pattern with CAD (Computer Aided Design) data used in drawing the reticle pattern.

Herein, the term "die" is equivalent in meaning to a block of pattern area or its detected image for use as a unit to be subjected to pattern comparison. On the other hand, the term "database" means a reference image synthesized from CAD data in contrast with an actual pattern image detected by an optical system.

A conventional reticle inspecting apparatus comprises an XY stage on which a reticle is mounted, an image-pickup optical system for picking up an image of a pattern of the reticle mounted on the XY stage as a picked-up image, an image input section for acquiring the picked-up image from the image-pickup optical system, a data converter for converting CAD data used in drawing the pattern of the reticle into a reference image, an image comparator for comparing the picked-up image and the reference image to detect a pattern defect, and a controller for controlling a whole of the apparatus.

In the conventional reticle inspecting apparatus described above, the stage with the reticle mounted thereon is moved and an image of a single frame of the pattern on the reticle is acquired by the image-pickup optical system and the image input section. The image thus acquired is transferred to the image comparator. On the other hand, the reference image is preliminarily obtained by conversion from the CAD data at the data converter and is sent to the image comparator in synchronism with the image. The image comparator compares the image and the reference image to detect any defect.

The single frame referred to herein is a unit of image which can be simultaneously processed by the image comparator.

Generally, as compared with an image acquiring time required in acquiring the image by the image-pickup optical system and the image input section, a transfer time required in transfer from the image input section to the image comparator, a data conversion time required in conversion of the CAD data, and an image processing time required in detection of any defect are considerably long. Therefore, in the conventional reticle inspecting apparatus of the above-mentioned structure, an image of a next frame acquired by the image input section can not be transferred unless a series of the above-mentioned defect detecting operations have been completed for a preceding frame. This results in occurrence of a latency.

In view of the above, time adjustment is carried out, for example, by decreasing a moving speed of the stage to delay the image acquiring time. Therefore, a whole inspecting time is unfavorably prolonged.

SUMMARY OF THE INVENTION

It is therefore an object of this invention to provide a reticle inspecting apparatus capable of shortening an inspecting time required in inspecting the appearance of a pattern of a reticle for producing an integrated circuit.

According to a first aspect of this invention, a reticle inspecting apparatus for detecting a pattern defect of a reticle for producing an integrated circuit comprises an XY stage on which the reticle is mounted; an image-pickup optical system for picking up an image of a pattern of the reticle mounted on the XY stage to obtain a picked-up image pattern having first through N-th (N being an integer not smaller than two) frames; first through M-th (M being an integer not smaller than two and not greater than N) image comparators; a distributor for distributing the first through the N-th frames of the picked-up image pattern to the first through the M-th image comparators one after another; and an inspection controller for converting CAD (Computer Aided Design) data used in drawing the pattern of the reticle into first through N-th intermediate data corresponding to the first through the N-th frames of the picked-up image pattern and for preliminarily transferring the first through the N-th intermediate data to the first through the M-th image comparators one after another. The first through the M-th image comparators compare the first through the N-th frames of the picked-up image pattern with first through N-th reference images produced from the first through the N-th intermediate data, respectively, to detect any defect in the first through the N-th frames of the picked-up image pattern.

According to a second aspect of this invention, the image-pickup optical system comprises a laser-scanning optical system and a transmitting light detector. The laser-scanning optical system produces a laser beam to scan in a Y direction a surface of the reticle mounted on the XY stage and moves the XY stage in an X direction perpendicular to the Y direction. The transmitting light detector detects a transmitting light obtained by transmission of the laser beam through the reticle to acquire each of the first through the N-th frames of the picked-up image pattern as a two-dimensional image pattern.

According to a third aspect of this invention, the first through the M-th image comparators transfer to the inspection controller detection results obtained by detecting any defect in the first through the N-th frames of the picked-up image pattern, respectively.

According to a fourth aspect of this invention, the distributor comprises first through M-th frame buffer memories for temporarily memorizing the first through the N-th frames of the picked-up image pattern, respectively. The distributor distributes the first through the N-th frames memorized in the first through the M-th frame buffer memories, respectively, to the first through the M-th image comparators one after another.

According to a fifth aspect of this invention, a reticle inspecting apparatus for comparing reference and comparison die patterns of a reticle for producing an integrated circuit to detect any defect in the patterns comprises an XY stage on which the reticle is mounted, an image-pickup optical system for picking up an image of the reference die pattern of the reticle mounted on the XY stage to obtain a picked-up reference die pattern having first through N-th (N being an integer not smaller than two) frames and thereafter picking up an image of the comparison die pattern of the reticle mounted on the XY stage to obtain a picked-up comparison die pattern having first through N-th frames, first through M-th (M being an integer not smaller than two and not greater than N) image comparators, and a distributor for distributing the first through the N-th frames of the picked-up reference die pattern to the first through the M-th image comparators one after another and thereafter distributing the first through the N-th frames of the picked-up comparison die pattern to the first through the M-th image comparators one after another. The first through the M-th image comparators comprise first through M-th die memories for memorizing the first through the N-th frames of the picked-up reference die pattern as first through N-th memorized frames. The first through the M-th image comparators compare with the first through the N-th memorized frames the first through the N-th frames of the picked-up comparison die pattern which are transferred following the first through the N-th frames of the picked-up reference die pattern to detect any defect between each of the first through the N-th frames of the picked-up reference die pattern and each corresponding one of the first through the N-th frames of the picked-up comparison die pattern.

According to a sixth aspect of this invention, the image-pickup optical system comprises a laser-scanning optical system and a transmitting light detector. The laser-scanning optical system produces a laser beam to scan in a Y direction a surface of the reticle mounted on the XY stage and moves the XY stage in an X direction perpendicular to the Y direction. The transmitting light detector detects a transmitting light obtained by transmission of the laser beam through the reticle to acquire each of the first through the N-th frames of the picked-up reference die pattern and the first through the N-th frames of the picked-up comparison die pattern as a two-dimensional image pattern.

According to a seventh aspect of this invention, the distributor comprises first through M-th frame buffer memories for temporarily memorizing the first through the N-th frames of the picked-up reference die pattern. The distributor distributes to the first through the M-th image comparators one after another the first through the N-th frames of the picked-up reference die pattern which are memorized in the first through the M-th frame buffer memories, respectively. Thereafter, the first through the M-th frame buffer memories temporarily memorize the first through the N-th frames of the picked-up comparison die pattern. The distributor distributes to the first through the M-th image comparators one after another the first through the N-th frames of the picked-up comparison die pattern which are memorized in the first through the M-th frame buffer memories, respectively.

DESCRIPTION OF THE PREFERRED EMBODIMENT

Figure 1:
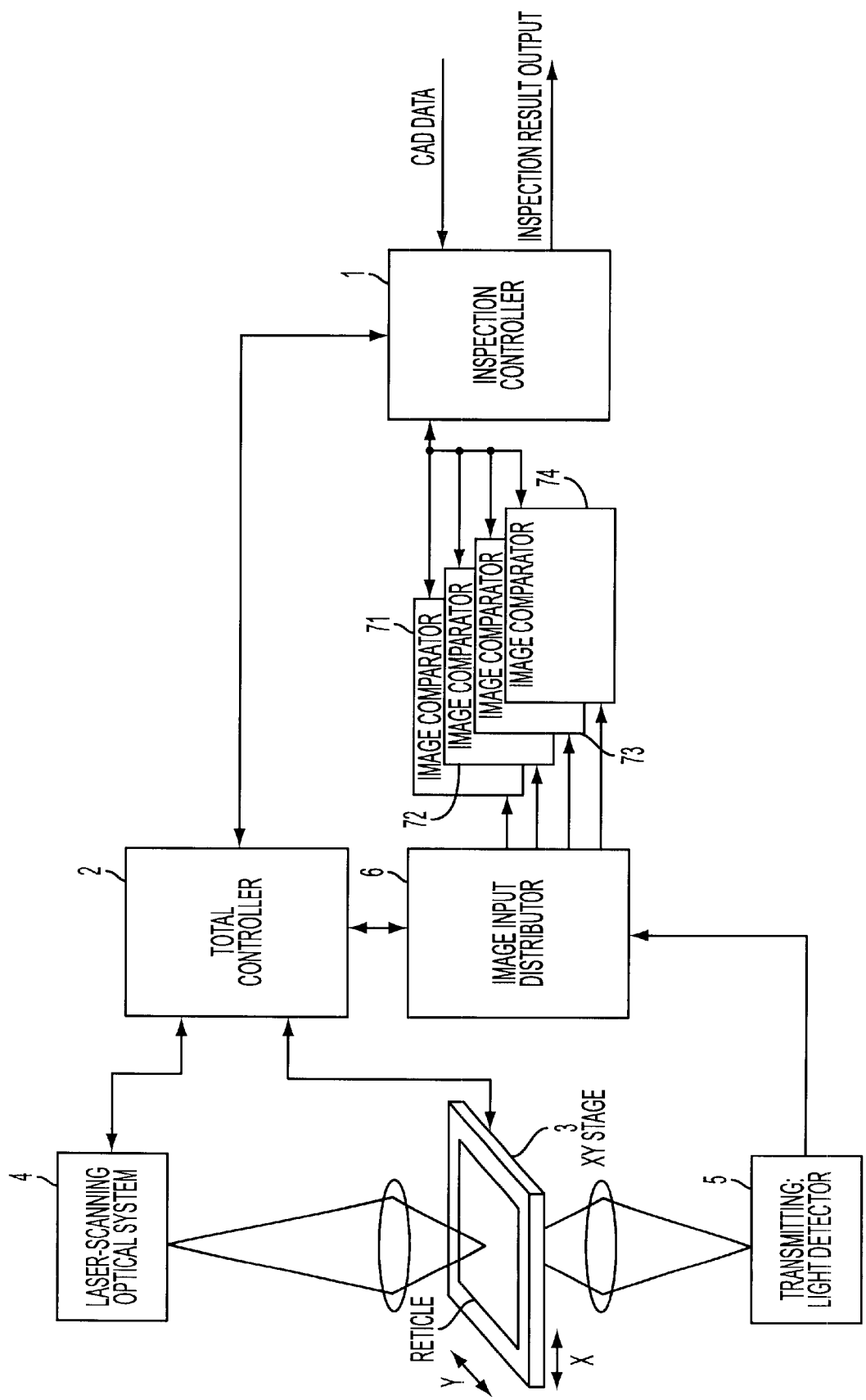
FIG. 1 is a block diagram of a reticle inspecting apparatus according to one embodiment of this invention.

Now, description will be made about an embodiment of this invention with reference to the drawing.

Referring to FIG. 1, a reticle inspecting apparatus according to one embodiment of this invention comprises an XY stage 3 on which a reticle is mounted, and an image-pickup optical system for picking up as a picked-up image an image of a pattern of the reticle mounted on the XY stage 3. The image-pickup optical system comprises a laser-scanning optical system 4 and a transmitting light detector 5 which will later be described.

An image input distributor 6 distributes the picked-up image of the pattern frame by frame for delivery to a plurality of image comparators 71 through 74 one after another.

Each of the image comparators 71 through 74 carries out generation of a reference image and detection of a pattern defect as will later be described.

An inspection controller 1 has a function of converting CAD data used in drawing the pattern of the reticle into intermediate data to be distributed to the image comparators 71 through 74 (as will later be described) and another function of producing an inspection result output representative of defect information detected by the image comparators 71 through 74 (as will later be described).

A total controller 2 controls the XY stage 3, the laser-scanning optical system 4 of the image-pickup optical system, the image input distributor 6, and the inspection controller 1.

In the above-mentioned reticle inspecting apparatus, preliminarily processing is carried out. Specifically, the inspection controller 1 acquires the CAD data used in drawing the pattern of the reticle, converts the CAD data into the reference image intermediate data frame by frame, and transfers the intermediate data to the image comparators 71 through 74 one after another.

The intermediate data referred to herein are compressed data which can easily be developed into the reference image (bit map).

The reason why the conversion into the intermediate data is carried out is as follows. If the CAD data are developed into the reference image (bit map), a long time is required to transfer. In addition, an enormous memory is required so that hardware becomes expensive.

When an inspection is started, the image is acquired frame by frame by the image-pickup optical system (the laser-scanning optical system 4 and the transmitting light detector 5) and the image input distributor 6 to be delivered to the image comparators 71 through 74 through channels switched one after another. Each of the image comparators 71 through 74 produces the reference image from the intermediate data is synchronism with image transfer and compares the image transferred thereto and the reference image to detect any defect.

When the image is distributed to the last channel, the image input distributor 6 restart the distribution back to the first channel. Subsequently, distribution is repeated in a cyclic fashion.

Therefore, each of the image comparators 71 through 74 carries out a series of defect detecting operations within a single cycle time. Therefore, as the number of the channels is greater, each of the image comparators 71 through 74 is given a longer processing time.

Thus, transfer from the image input section to the image comparator, data conversion of the CAD data, and defect detection which require a long time in the conventional reticle inspecting apparatus are multiplexed in the above-mentioned reticle inspecting apparatus. Upon acquisition of every single frame of image, the image is sent to the image comparators through the channels switched one from another. Thus, a latency at the image input section is eliminated to shorten a total inspecting time.

Figure 2:
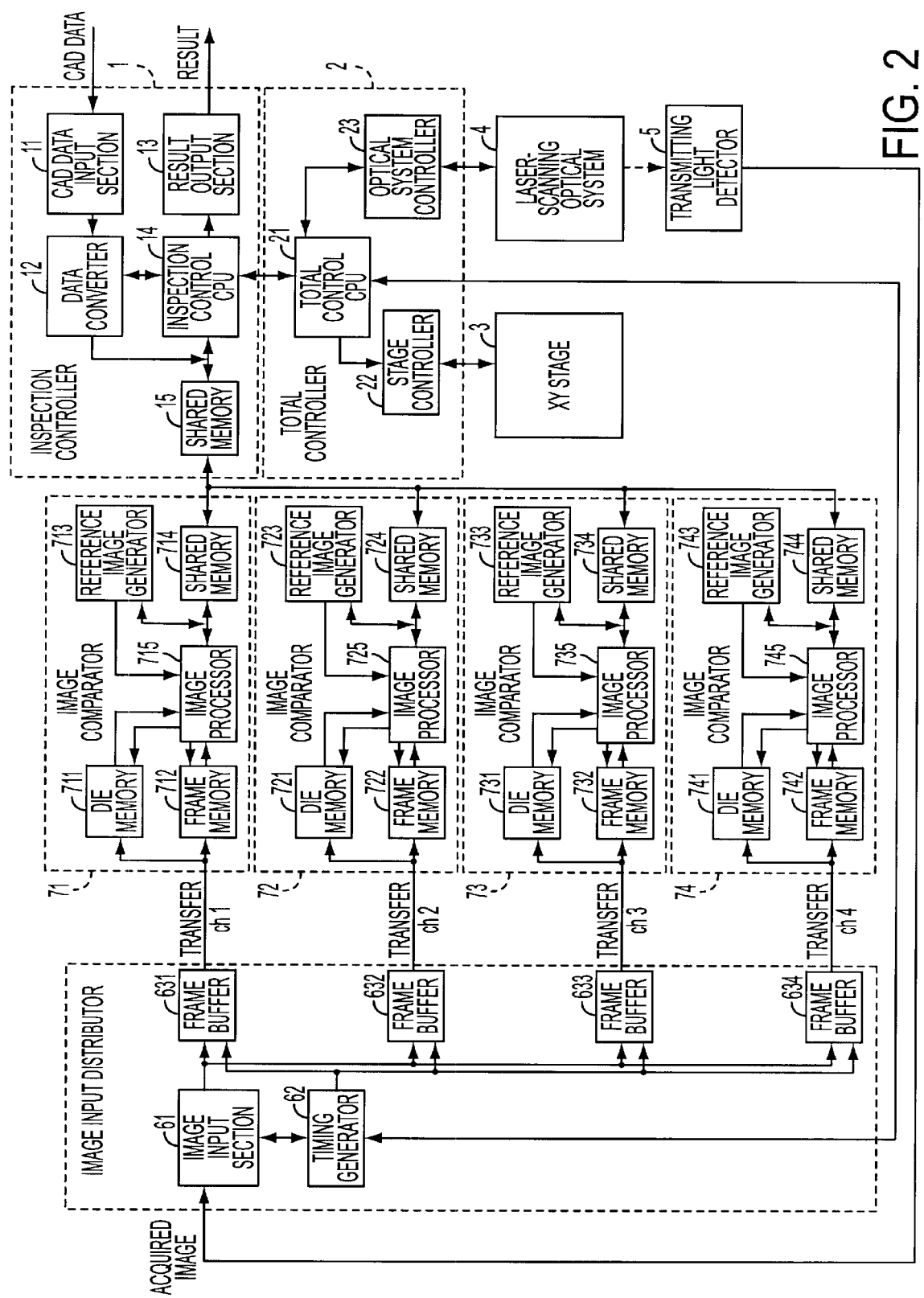
FIG. 2 is a block diagram showing the detail of the reticle inspecting apparatus in FIG. 1.

Referring to FIG. 2, the reticle inspecting apparatus is illustrated in detail.

As described above, inspection of the appearance of a pattern or a reticle is carried out by two kinds of methods, i.e., the "die-to-database inspection" and the "die-to-die inspection". At first, description will be made about an operation of the reticle inspecting apparatus in FIG. 2 in conjunction with the "die-to-database inspection" in which the acquired image is compared with the CAD data used in drawing the reticle pattern.

Prior to start of the "die-to-database inspection", a total control CPU (Central Processing Unit) 21 in the total controller 2 makes the inspection controller 1 perform the preliminary processing which will presently be described.

Specifically, the inspection controller 1 carries out the preliminary processing in the following manner. A cad data input section 11 acquires the CAD data used in drawing the pattern of the reticle to be inspected. A data converter 12 successively converts the CAD data into the reference image intermediate data per frame under control of an inspection control CPU 14. The reference image intermediate data per frame are successively transferred through a shared memory 15 to the image comparators 71 through 74 one after another. After completion of the above-mentioned preliminary processing, the inspection control CPU 14 informs the completion of the preliminary processing to the total control CPU 21 of the total controller 2.

Informed of the completion of the preliminary processing, the total control CPU 21 of the total controller 2 starts the "die-to-database inspection". Specifically, the total control CPU 21 sends an instruction to a stage controller 22 and an optical system controller 23 to made the XY stage 3 and the laser-scanning optical system 4 start image acquisition.

Figure 3:
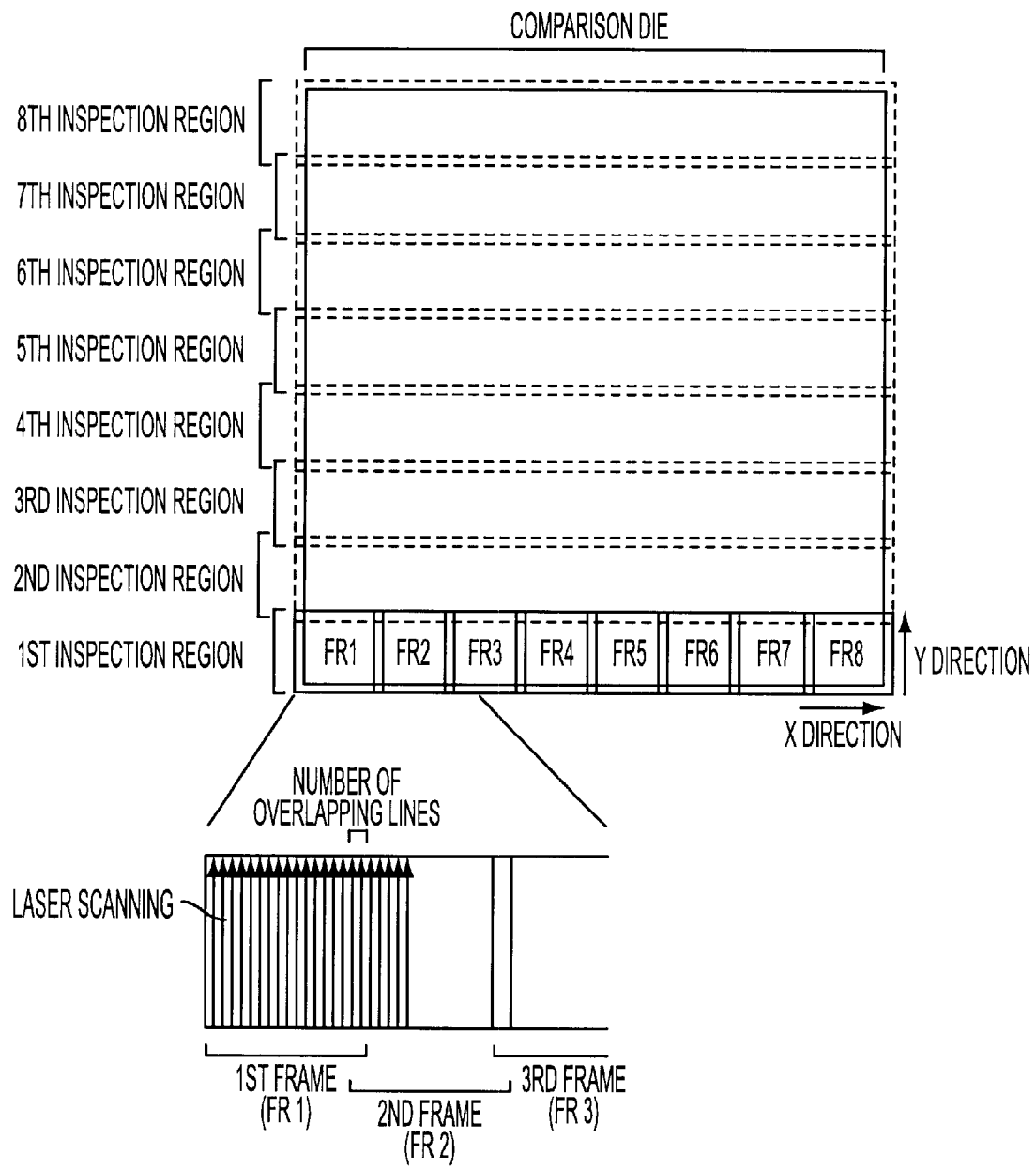
FIG. 3 is a view for describing die-to-database inspection by the reticle inspecting apparatus in FIG. 2.

Referring to FIG. 3 in addition to FIG. 2, first (FR1) through eighth (FR8) frames of a first inspection region of the reticle on the XY stage 3 are acquired in the following manner. The XY stage 3 is moved in an X direction at a constant speed. At every movement of a predetermined pitch in the X direction, the laser-scanning optical system 4 performs scanning by a laser beam in a Y direction (see an enlarged part in FIG. 3). A transmitting light is detected by the transmitting light detector 5 to acquire a two-dimensional image. Subsequently, the second inspection region is acquired in the similar manner after the XY stage 3 is moved in the Y direction at a preselected pitch. By repeating a series of operations mentioned above, the images of an entire surface of the reticle are acquired as a comparison die. The acquired images are detected by the transmitting light detector 5 and delivered to the image input distributor 6.

Figure 4:
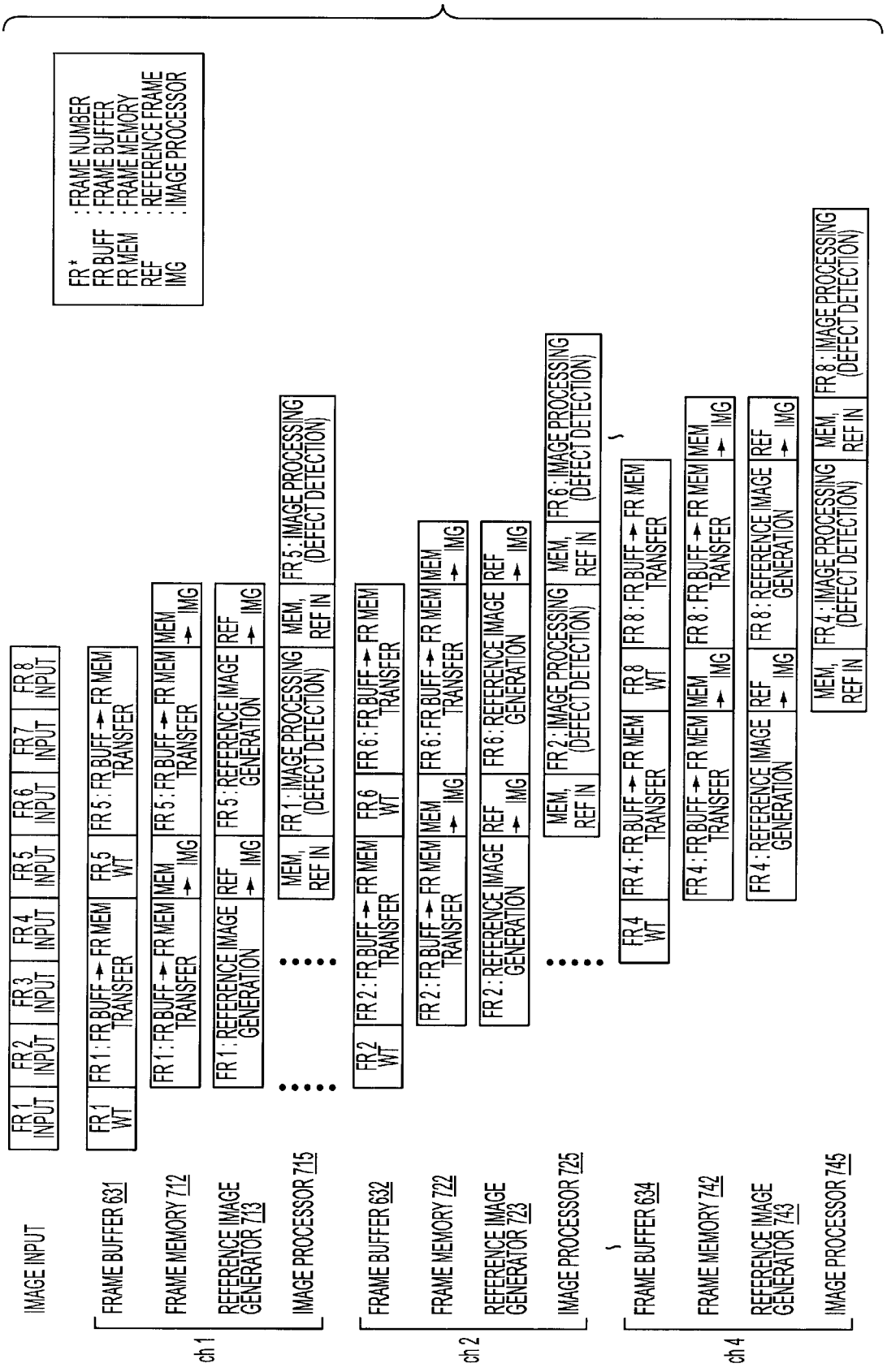
FIG. 4 is a timing chart for describing the die-to-database inspection by the reticle inspecting apparatus in FIG. 2.

Referring to FIG. 4 in addition to FIG. 2, an image input section 61 of the image input distributor 6 is supplied with the acquired images (FR1–FR8) as FR1 INPUT through FR8 INPUT which are separated per frame under control of a timing generator 62 to be written in frame buffers (frame buffer memories) 631 through 634 as FR1 WT through FR4 WT (FR5 WT through FR8 WT), respectively.

The timing generator 62 is preliminarily supplied from the total control CPU 21 with the number of scanning lines in each single frame and the number of overlapping lines common to every adjacent frames (the enlarged part in FIG. 3). In response to an image acquisition start signal from the total control CPU 21, the image acquisition is started. Specifically, the number of input lines is monitored and those of the frame buffers 631 through 634 into which the acquired images are to be written are selected.

At this time, a part of each acquired image which corresponds to the overlapping lines common to every adjacent frames is simultaneously written in two frame buffers.

The number of the overlapping lines is required in order to avoid the following problem. Every adjacent frames are processed by two different ones of the image comparators 71 through 74. If any defect is present at a boundary between the frames, information of an area therearound is lost and the defect can not be identified.

The frame (FR1) first acquired is written as FR1 WT into the frame buffer 631 for transfer on the channel 1 (CH1). Simultaneously when writing is completed, transfer is started from the frame buffer (FR BUFF) 631 to a frame memory (FR MEM) 712 of the image comparator 71.

The image input section 61 acquires the next frame (FR2) without any latency and writes the next frame as FR2 WT into the frame buffer 632 for transfer on the channel 2 (CH2). Subsequently, the frame buffers are switched one from another for writing until the frame buffer 634 is reached.

After completion of writing into the frame buffer 634, writing returns to the frame buffer 631. Thus, image acquisition, writing, and transfer are cyclically performed. Therefore, a time period from writing into a particular frame buffer to next writing into the particular frame buffer corresponds to an image processing time (cycle time) of each single frame. It is required that each of the image comparators 71 through 74 completes the processing within the cycle time.

On the other hand, the reference images to be compared are generated by reference image generators 713, 723, 733, and 743 in the image comparators 71 through 74 by the use of reference image data in shared memories 714, 724, 734, and 744, respectively, in realtime upon every frame comparison. As described above, the data converter 12 converts the CAD data into the intermediate data which can easily be developed, as the preliminarily processing. The intermediate data are transferred as the reference image intermediate data through the shared memory 15 to the shared memories 714, 724, 734, and 744 of the image comparators 71 through 74, respectively.

Hereinafter, description will be made about an operation of the image comparator 71. Each of the remaining image comparators 72 through 74 also carries out the similar operation in an asynchronous fashion.

When the inspection is started, the reference image generator 713 fetches from the shared memory 14 the reference image intermediate data of the first frame (FR1), develops the reference image intermediate data into a bit map, and performs a gradation treatment to generate the reference image. The gradation treatment is required to render the reference image comparable with the acquired image.

When the image of the first frame (FR1) is transferred to the frame memory 712, the reference image is also delivered from the reference image generator 713 to the image processor 715 in synchronism with the image of the first frame (FR1).

Immediately after completion of delivery of the reference image to the image processor 715, the reference image generator 713 fetches the reference image intermediate data of the next frame (FR5) from the shared memory 714 to generate the reference image. Thus, the image generator 713 generates always in advance the reference image for use in next comparison so as to avoid occurrence of the latency in the image processor 715.

The image processor 715 compares frame by frame the image transferred to the frame memory 712 and the reference image generated by the reference image generator 713 to perform the defect detecting operation. The defect detection result is supplied through the shared memory 714 to the inspection control CPU 14.

The inspection control CPU 14 sums the defect detection results supplied from the image comparators 71 through 74 taking into account the number of the overlapping lines of the frames, generates defect information for a whole of the reticle, and delivers the defect information from a result output section 13.

Next, description will be made about an operation of the reticle inspection device in FIG. 2 in case of the "die-to-die inspection" in which identical patterns at different positions on a single common reticle are compared with each other.

Figure 5:
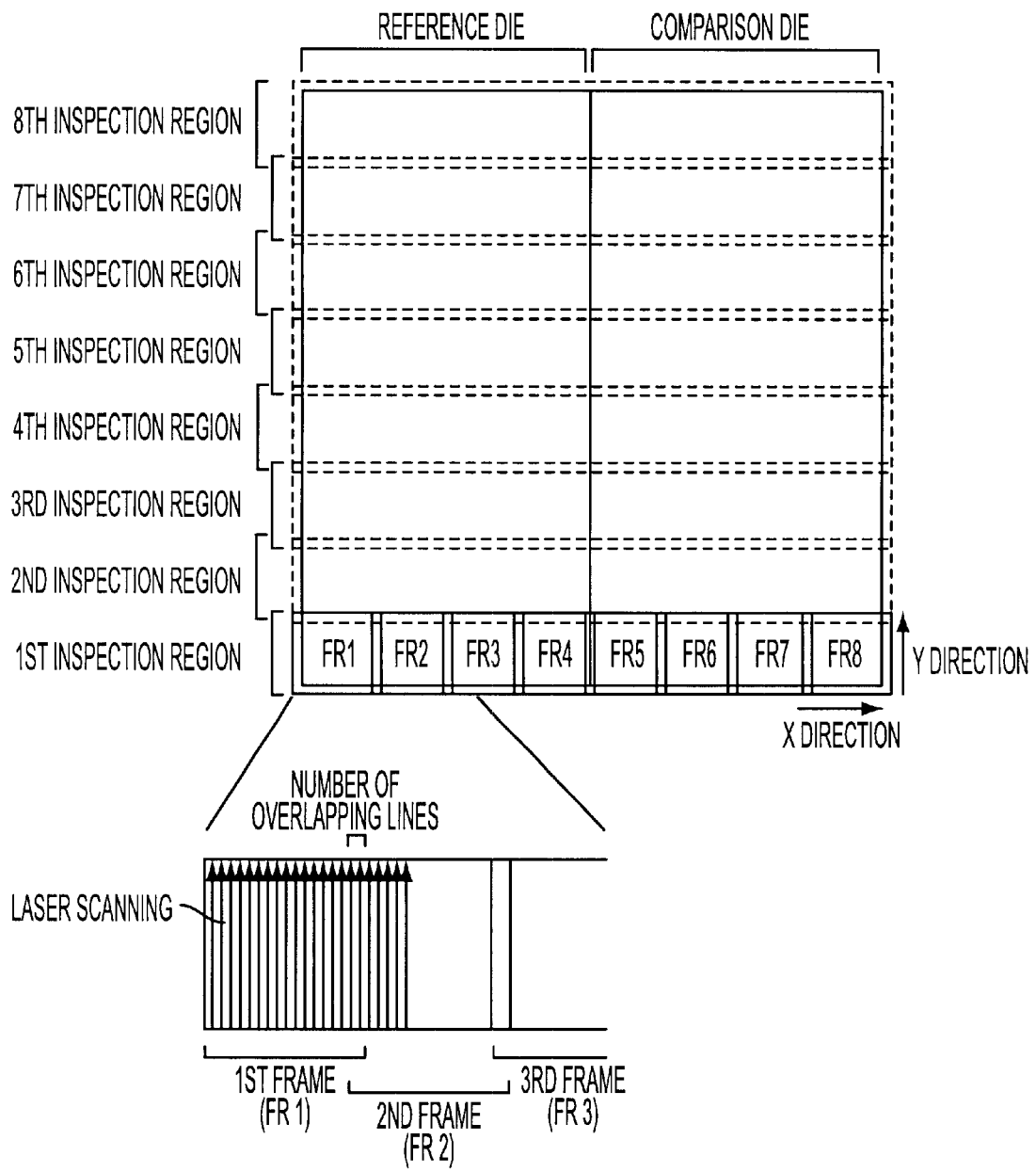
FIG. 5 is a view for describing die-to-die inspection by the reticle inspecting apparatus in FIG. 2.

Referring to FIG. 5 in addition to FIG. 2, the "die-to-die inspection" is carried out in the following manner. At first, images of a reference die (FIG. 5) are fetched and stored in die memories 711, 721, 731, 741 of the image comparators 71, 72, 73, and 74, respectively. Thereafter, images of a comparison die (FIG. 5) are fetched. The image comparators 71, 72, 73, and 74 extract the reference die from the die memories 711, 721, 731, and 741 frame by frame, respectively, and compare the comparison die with the reference die to detect any defect. Hereafter, the "die-to-die inspection" will be described in detail.

In FIG. 2, the total control CPU 21 of the total controller 2 makes the inspection controller 1 perform preliminary processing, which will presently be described, prior to start of the "die-to-die" inspection.

Specifically, as the preliminary processing, the inspection control CPU 14 of the inspection controller 1 preliminarily calculates, as a result of division of a total number of frames to be dealt as the reference die (in the example being illustrated in FIG. 5, the total number of frames of the reference die is equal to four) by the total number of the frame buffers 631 through 634 (four in FIG. 2), division result value (therefore, in the example being illustrated in FIGS. 2 and 5, the total number of the frames of the reference die/the total number of the frame buffers=1) and a start frame number of the comparison die (in the example of FIG. 5, the start frame number of the comparison die=5). These values are transferred through the shared memory 15 to the shared memories 714, 724, 734, and 744 of the image comparators 71 through 74.

Referring to FIG. 2, the inspection control CPU 14 informs, upon completion of the preliminary processing, the completion of the preliminary processing to the total control CPU 21 of the total controller 2.

Informed of the completion of the preliminary processing, the total control CPU 21 of the total controller 2, starts the "die-to-die" inspection. Specifically, the total control CPU 21 sends an instruction to the stage controller 22 and the optical system controller 23 to make the XY stage 3 and the laser-scanning optical system 4 start image acquisition.

Referring to FIG. 5 in addition to FIG. 2, the reference die from the first (FR1) to the fourth (FR4) frames and the comparison die from the fifth (FR5) to the eighth (FR8) frames of the first inspection region of the reticle on the XY stage 3 are acquired in the following manner. The XY stage 3 is moved in the X direction at the constant speed. At every movement of the predetermined pitch in the X direction, the laser-scanning optical system 4 performs scanning by a laser beam in the Y direction (see an enlarged part in FIG. 5). A transmitting light is detected by the transmitting light detector 5 to acquire a two-dimensional image. Subsequently, the second inspection region is acquired in the similar manner after the XY stage 3 is moved in the Y direction at the preselected pitch. By repeating a series of operations mentioned above, the images of an entire surface of the reticle are acquired. The acquired images are detected by the transmitting light detector 5 and delivered to the image input distributor 6.

Figure 6:
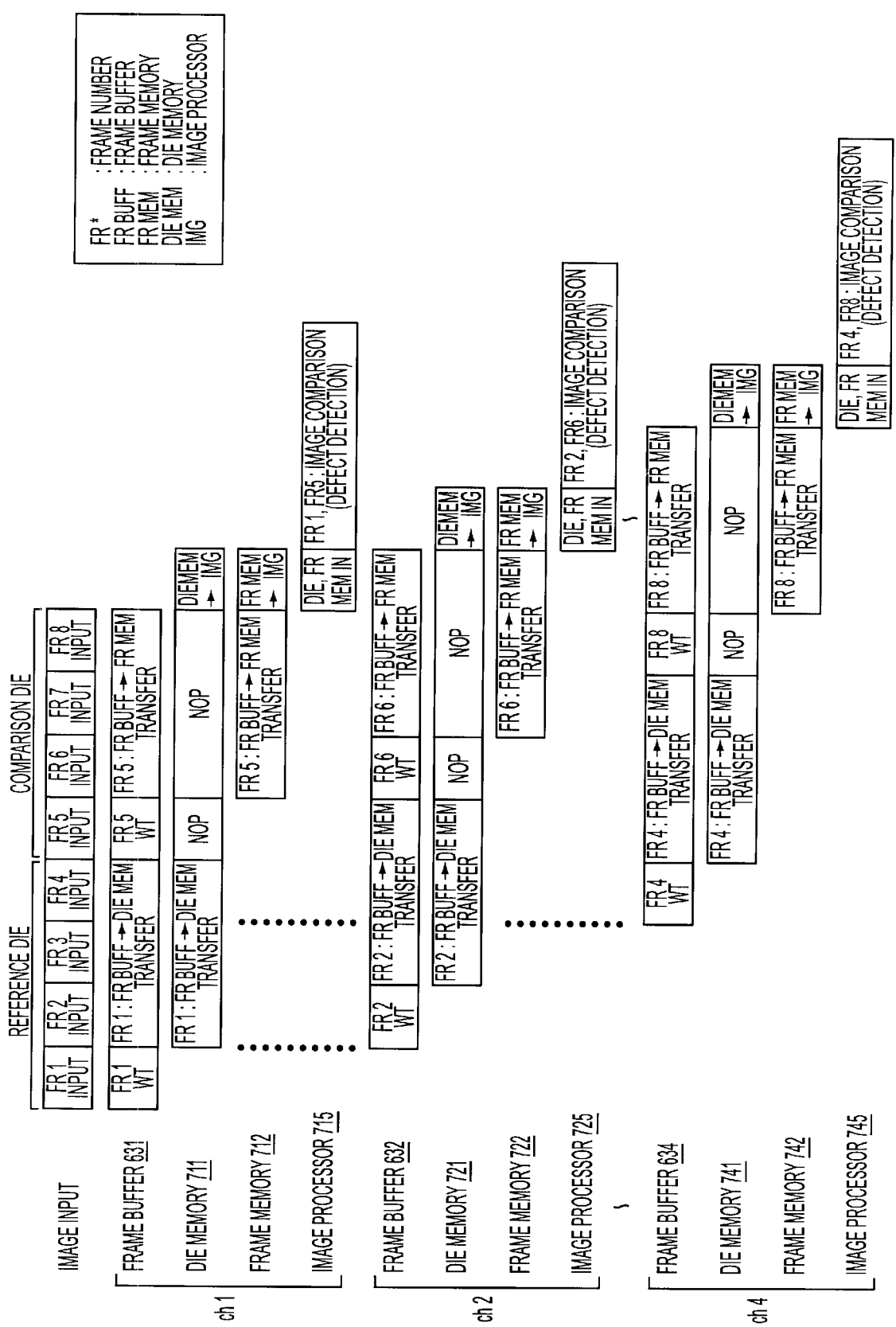
FIG. 6 is a timing chart for describing the die-to-die inspection by the reticle inspecting apparatus in FIG. 2.

Referring to FIG. 6 in addition to FIG. 2, the image input section 61 of the image input distributor 6 is supplied with the acquired images (FR1–FR8) as FR1 INPUT through FR8 INPUT which are separated per frame under control of the timing generator 62 to be written in the frame buffers 631 through 634 as FR1 WT through FR4 WT (FR5 WT through FR8 WT), respectively.

The timing generator 62 is preliminarily supplied from the total control CPU 21 with the number of scanning lines in each single frame and the number of overlapping lines common to every adjacent frames (the enlarged part in FIG. 5). In response to the image acquisition start signal from the total control CPU 21, the image acquisition is started. Specifically, the number of input lines is monitored and those of the frame buffers 631 through 634 into which the acquired images are to be written are selected.

At this time, a part of each acquired image which corresponds to the overlapping lines common to every adjacent frames is simultaneously written in two frame buffers.

The number of the overlapping lines is required in order to avoid the following problem. Every adjacent frames are processed by two different ones of the image comparators 71 through 74. If any defect is present at a boundary between the frames, information of an area therearound is lost and the defect can not be identified.

The frame (FR1) first acquired is written as FR1 WT into the frame buffer 631 for transfer on the channel 1 (CH1). Simultaneously when writing is completed, transfer is started from the frame buffer (FR BUFF) 631 to the image comparator 71.

The image input section 61 acquires the next frame (FR2) without any latency and writes the next frame as FR2 WT into the frame buffer 632 for transfer on the channel 2 (CH2). Subsequently, the frame buffers are switched one from another for writing until the frame buffer 634 is reached.

After completion of writing into the frame buffer 634, writing returns to the frame buffer 631. Thus, image acquisition, writing, and transfer are cyclically performed.

Thus, the images are supplied to the image input section 61 and successively separated per frame under control of the timing generator 62, written in the frame buffers 631 through 634 one after another, and transferred to the image comparators 71 through 74, respectively.

Hereinafter, description will be made about an operation of the image comparator 71. Each of the remaining image comparators 72 through 74 also carries out the similar operation in an asynchronous fashion.

The image processor 715 of the image comparator 71 reads from the shared memory 714 the total number of the frames of the reference die/the total number of the frame buffers=1 and the start frame number of the comparison die=5. The die memory 711 is activated to write the frames transferred from the frame buffer 631. The die memory 711 stores the frames until the number of the frames reaches the total number of frames of the reference die/the total number of the frame buffers (1 in the illustrated example, as described above).

Next, upon reception of a start frame of the comparison die, the image processor 715 activates the frame memory 712 to transfer the image from the frame buffer 631 to the frame memory 712.

Then, the image processor 715 extracts from the die memory 711 the frame (FR1) first acquired as the reference frame, acquires the image (FR5) of the comparison frame from the frame memory 712, and compares these frames with each other to detect any defect. The result of detection is written in the shared memory 714. Subsequently, a similar cycle is repeated to carry out defect detection in all frames of the reference die and the comparison die.

In FIG. 6, NOP represents No Operation.

The foregoing description is directed to the case where the number of the image comparators 71 through 74 is equal to four. However, this invention is applicable to all cases where a plurality of image comparators are provided.

As described above, it is possible according to this invention to considerably shorten the inspecting time required in inspecting the appearance of the pattern of the reticle for producing a semiconductor circuit.

Specifically, according to this invention, the image comparators for carrying out image transfer, reference image generation, and comparison, which require a long time in the conventional apparatus, are multiplexed so that the acquired image is distributed frame by frame. Thus, it is possible to avoid occurrence of the latency at the image input section and to shorten the whole inspecting time.

What is claimed is:

1. A reticle inspecting apparatus for detecting a pattern defect of a reticle for producing an integrated circuit, said apparatus comprising:

an XY stage on which said reticle is mounted;

an image-pickup optical system for picking up an image of a pattern of said reticle mounted on said XY stage to obtain a picked-up image pattern having first through N-th (N being an integer not smaller than two) frames;

first through M-th (M being an integer not smaller than two and not greater than N) image comparators;

a distributor for distributing said first through said N-th frames of said picked-up image pattern to said first through said M-th image comparators one after another; and an inspection controller for converting CAD (Computer Aided Design) data used in drawing the pattern of said reticle into first through N-th intermediate data corresponding to said first through said N-th frames of said picked-up image pattern and for preliminarily transferring said first through said N-th intermediate data to said first through said M-th image comparators one after another;

said first through said M-th image comparators comparing said first through said N-th frames of said picked-up image pattern with first through N-th reference images produced from said first through said N-th intermediate data, respectively, to detect any defect in said first through said N-th frames of said picked-up image pattern.

2. A reticle inspecting apparatus as claimed in claim 1, wherein:

said image-pickup optical system comprises a laser-scanning optical system and a transmitting light detector, said laser-scanning optical system producing a laser beam to scan in a Y direction a surface of said reticle mounted on said XY stage and moving said XY stage in an X direction perpendicular to said Y direction, said transmitting light detector detecting a transmitting light obtained by transmission of said laser beam through said reticle to acquire each of said first through said N-th frames of said picked-up image pattern as a two-dimensional image pattern.

3. A reticle inspecting apparatus as claimed in claim 1, wherein:

said first through said M-th image comparators transfer to said inspection controller detection results obtained by detecting any defect in said first through said N-th frames of said picked-up image pattern, respectively.

4. A reticle inspecting apparatus as claimed in claim 1, wherein:

said distributor comprises first through M-th frame buffer memories for temporarily memorizing said first through said N-th frames of said picked-up image pattern, respectively;

said distributor distributing said first through said N-th frames memorized in said first through said M-th frame buffer memories, respectively, to said first through said M-th image comparators one after another.

5. A reticle inspecting apparatus for comparing reference and comparison die patterns of a reticle for producing an integrated circuit which are adjacent to each other, to detect any defect in said patterns, said apparatus comprising:

an XY stage on which said reticle is mounted;

an image-pickup optical system for picking up an image of said reference die pattern of said reticle mounted on said XY stage to obtain a picked-up reference die pattern having first through N-th (N being an integer not smaller than two) frames and thereafter picking up an image of said comparison die pattern of said reticle mounted on said XY stage to obtain a picked-up comparison die pattern having first through N-th frames;

first through M-th (M being an integer not smaller than two and not greater than N) image comparators; and a distributor for distributing said first through said N-th frames of said picked-up reference die pattern to said first through said M-th image comparators one after another and thereafter distributing said first through said N-th frames of said picked-up comparison die pattern to said first through said M-th image comparators one after another;

said first through said M-th image comparators comprising first through M-th die memories for memorizing said first through said N-th frames of said picked-up reference die pattern as first through N-th memorized frames;

said first through said M-th image comparators comparing with said first through said N-th memorized frames said first through said N-th frames of said picked-up comparison die pattern which are transferred following said first through said N-th frames of said picked-up reference die pattern to detect any defect between each of said first through said N-th frames of said picked-up reference die pattern and each corresponding one of said first through said N-th frames of said picked-up comparison die pattern.

6. A reticle inspecting apparatus as claimed in claim 5, wherein:

said image-pickup optical system comprises a laser-scanning optical system and a transmitting light detector, said laser-scanning optical system producing a laser beam to scan in a Y direction a surface of said reticle mounted on said XY stage and moving said XY stage in an X direction perpendicular to said Y direction, said transmitting light detector detecting a transmitting light obtained by transmission of said laser beam through said reticle to acquire each of said first through said N-th frames of said picked-up reference die pattern and said first through said N-th frames of said picked-up comparison die pattern as a two-dimensional image pattern.

7. A reticle inspecting apparatus as claimed in claim 5, wherein:

said distributor comprises first through M-th frame buffer memories for temporarily memorizing said first through said N-th frames of said picked-up reference die pattern;

said distributor distributing to said first through said M-th image comparators one after another said first through said N-th frames of said picked-up reference die pattern which are memorized in said first through said M-th frame buffer memories, respectively;

said first through said M-th frame buffer memories thereafter temporarily memorizing said first through said N-th frames of said picked-up comparison die pattern;

said distributor distributing to said first through said M-th image comparators one after another said first through said N-th frames of said picked-up comparison die pattern which are memorized in said first through said M-th frame buffer memories, respectively.

8. A reticle pattern defect inspection apparatus, comprising:

(a) an image input distributor configured to input a picked-up image of a reticle pattern as first through N-th (1–N frames), wherein N is an integer not smaller than two; and (b) first through M-th image comparators (1–M comparators), wherein M is an integer not smaller than two and not greater than N, configured to process an image in parallel, said processing to include receiving said 1–N frames from said image input distributor, comparing first through N-th data units of reference image data corresponding to said 1–N frames with said 1–N frames, and reporting any defects detected in said 1–N frames.

9. A reticle pattern defect inspection method comprising:

(a) inputting a picked-up image of a reticle pattern as first through N-th frames (1–N frames), wherein N is an integer not smaller than two;

(b) transmitting said 1–N frames to first through M-th image comparators (1–M comparators), wherein M is an integer not smaller than two and not greater than N, said 1–M comparators processing an image in parallel; and (c) comparing said 1–N frames with first through N-th data units of reference image data corresponding to said 1–N frames, and reporting any defects detected in said 1–N frames.

10. A computer readable medium incorporating program instructions configured to enable a processor to:

(a) input a picked-up image of a reticle pattern as first through N-th frames (1–N frames), wherein N is an integer not smaller than two;

(b) transmit said 1–N frames to first through M-th image comparators (1–M comparators), wherein M is an integer not smaller than two and not greater than N, said 1–M comparators processing an image in parallel; and (c) compare said 1–N frames with first through N-th data units of reference image data corresponding to said 1–N frames, and report any defects detected in said 1–N frames.

* * * * *